US007746174B2

(12) United States Patent
Yang et al.

(10) Patent No.: US 7,746,174 B2
(45) Date of Patent: Jun. 29, 2010

(54) SYSTEMS AND METHODS FOR POWER AMPLIFIER WITH INTEGRATED PASSIVE DEVICE

(75) Inventors: Ki Seok Yang, Atlanta, GA (US); Jaejoon Chang, Duluth, GA (US); Kyu Hwan An, Dunwoody, GA (US); Wangmyong Woo, Suwanee, GA (US); Chang-Ho Lee, Marietta, GA (US); Younsuk Kim, Yong-in (KR); Hyogun Bae, Seoul (KR); Kijoong Kim, Hwasung (KR); Shinichi Iizuka, Gyunggi-do (KR)

(73) Assignee: Samsung Electro-Mechanics Company, Ltd. (KR)

( * ) Notice: Subject to any disclaimer, the term of this patent is extended or adjusted under 35 U.S.C. 154(b) by 14 days.

(21) Appl. No.: 12/138,188

(22) Filed: Jun. 12, 2008

(65) Prior Publication Data

US 2009/0309662 A1 Dec. 17, 2009

(51) Int. Cl.
*H03F 3/68* (2006.01)

(52) U.S. Cl. .................... 330/295; 330/124 R; 330/301

(58) Field of Classification Search ......... 330/301–302, 330/295, 124 R, 275–276; 333/25–26
See application file for complete search history.

(56) References Cited

U.S. PATENT DOCUMENTS 5,796,165 A 8/1998 Yoshikawa et al.
6,462,950 B1 10/2002 Pohjonen
6,466,094 B2 10/2002 Leighton et al.
6,614,308 B2 9/2003 Moller et al.
6,674,632 B2 1/2004 Kiewitt et al.
6,798,295 B2 9/2004 Pengelly et al.
6,818,979 B2 11/2004 Takehara et al.
6,882,263 B2 * 4/2005 Yang et al. .................. 336/200
7,061,329 B2 6/2006 Inoue et al.
7,091,791 B1 * 8/2006 Terrovitis .................. 330/301
7,092,678 B2 8/2006 Shih
7,157,965 B1 * 1/2007 Kim ....................... 330/124 R
7,176,579 B2 2/2007 Konishi et al.
7,192,788 B2 3/2007 Kurokawa
7,276,420 B2 10/2007 Liu et al.
7,288,995 B2 10/2007 Vaisanen
7,348,656 B2 3/2008 Briere
7,365,602 B2 * 4/2008 Bhatti et al. ................ 330/295
7,425,869 B2 * 9/2008 Aoki et al. .................. 330/276
2006/0284685 A1 * 12/2006 Vaisanen .................... 330/302
2008/0164941 A1 * 7/2008 Lee et al. ................ 330/124 R

* cited by examiner

*Primary Examiner*—Robert Pascal
*Assistant Examiner*—Hieu P Nguyen
(74) *Attorney, Agent, or Firm*—Sutherland Asbill & Brennan LLP

(57) ABSTRACT

Embodiments of the invention may provide for systems and methods for providing a power amplifier with integrated passive device, thereby improving the performance of the power amplifier. The power amplifier may include a signal amplification section, a power combining section, and a coupling device section that interconnects the signal amplification section and the power combining section. The signal amplification section may be implemented on a first substrate, and the power combining section may be implemented on a second substrate, where the first substrate and the second substrate may be different. The power combining section may be implemented by the integrated passive device (IPD) that may have characteristics of high performance passive device with flexibility of implementing diverse functions, including a notch filter, a low pass filter, and/or bypass capacitance for bias network. The power combining section implemented by the integrated passive device may have an improved power combining efficiency.

13 Claims, 7 Drawing Sheets

SYSTEMS AND METHODS FOR POWER AMPLIFIER WITH INTEGRATED PASSIVE DEVICE

FIELD OF THE INVENTION

Embodiments of the invention relate generally to a power amplifier, and more particularly, to a power amplifier with integrated passive device (IPD) that improves power combining efficiency.

BACKGROUND OF THE INVENTION

Currently, the power amplifier for mobile communication has been implemented using a gallium-arsenide field effect transistor (GaAs FET), gallium-arsenide heterojunction bipolar transistor (GaAs HBT), a laterally diffused metal oxide silicon (LDMOS), or a indium-gallium-phosphide heterojunction bipolar transistor (InGaP HBT). These power amplifiers can achieve the output power (Pout) and the power added efficiency (PAE) for the wireless communication; however, they have some disadvantages in requiring an additional power controller chip, additional output matching circuits, and the like.

To improve these issues, the complementary metal-oxide-semiconductor (CMOS) process has been used to implement the power amplifier, thereby offering a high level integration with power controller circuits and low cost as compared to GaAs and other traditional processes. However, the silicon (Si) substrate used in a traditional CMOS process is conductive, which increases RF loss and severely degrades the performance of passive circuit elements. Accordingly, there is a need for novel CMOS power amplifier designs that include integrated passive devices on highly resistive substrates so that the performance of the passive device is not degraded.

BRIEF SUMMARY OF THE INVENTION

According to an example embodiment of the invention, there may be a power amplifier. The power amplifier may include a signal amplification section that includes a plurality of power devices, where the signal amplification may receive an input radio frequency (RF) signal, and where the plurality of power devices may be operative to amplify the input RF signal to generate a respective plurality of amplified signals. The power amplifier may also include a signal combining section that is operative to combine the plurality of amplified signals into an output signal for delivery to a load, where the signal combining section may be physically distinct from the signal amplification section. Additionally, the power amplifier may include a coupling device section that electrically connects the signal amplification section and the signal combining section.

According to another example embodiment of the invention, there may be a method for a power amplifier. The method may include fabricating a signal amplification section on a first substrate using a first fabrication process, where the signal amplification section may include a plurality of power devices for amplifying an input RF signal to generate a respective plurality of amplified signals, fabricating a signal combining section on a second substrate using a second fabrication process different from the first fabrication process, where the signal combining section may be operative to combine the plurality of amplified signals into an output signal for delivery to a load, and electrically connecting the signal amplification section and the signal combining section.

BRIEF DESCRIPTION OF THE DRAWINGS

Figure 1:
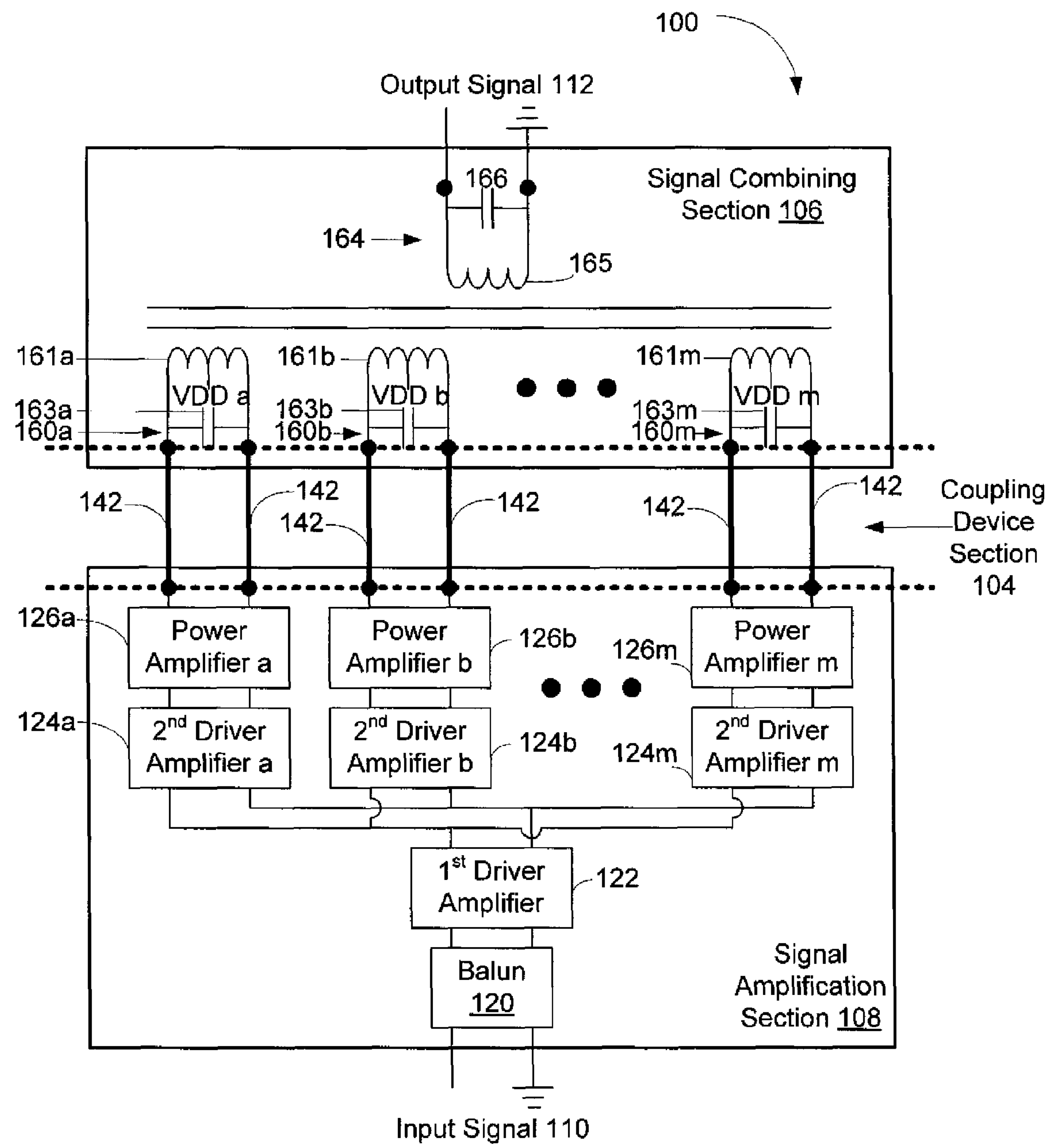

Having thus described the invention in general terms, reference will now be made to the accompanying drawings, which are not necessarily drawn to scale, and wherein:

FIG. 1 illustrates an example power amplifier in accordance with an example embodiment of the invention.

Figure 2:
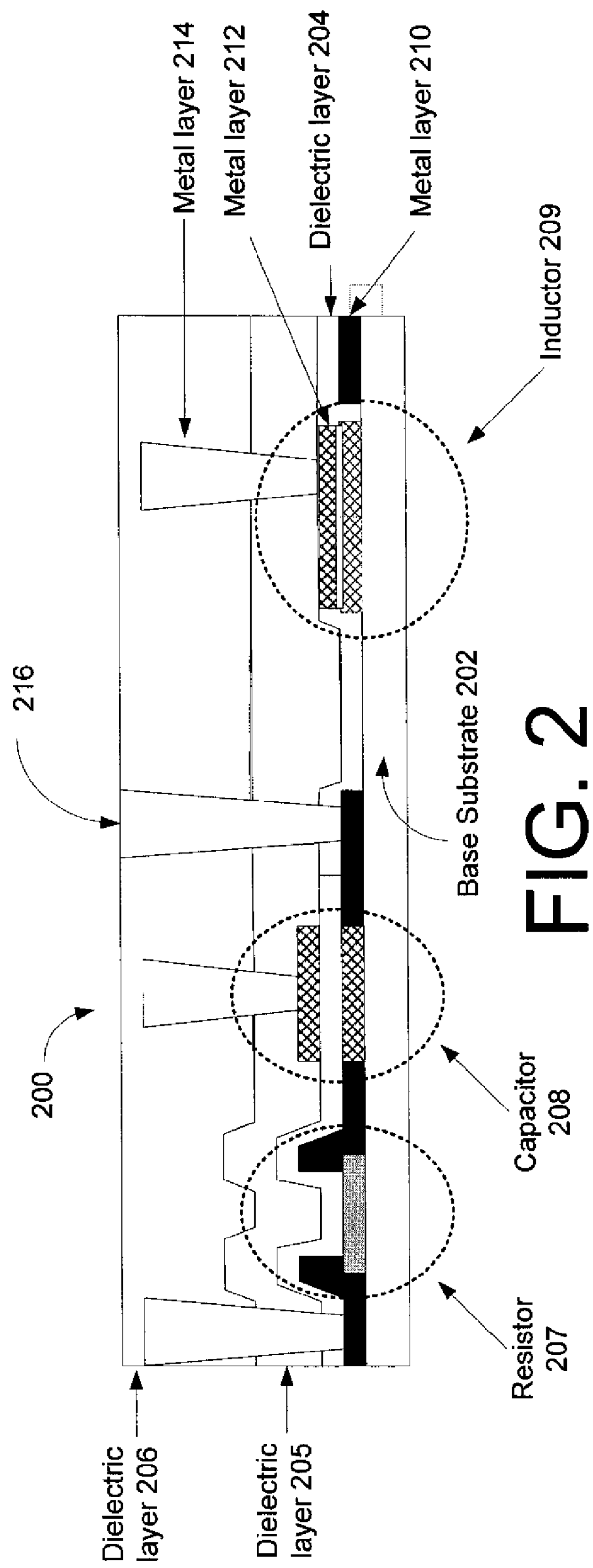

FIG. 2 illustrates an example integrated passive device (IPD) stackup for a signal combining section, according to an example embodiment of the invention.

Figure 3:
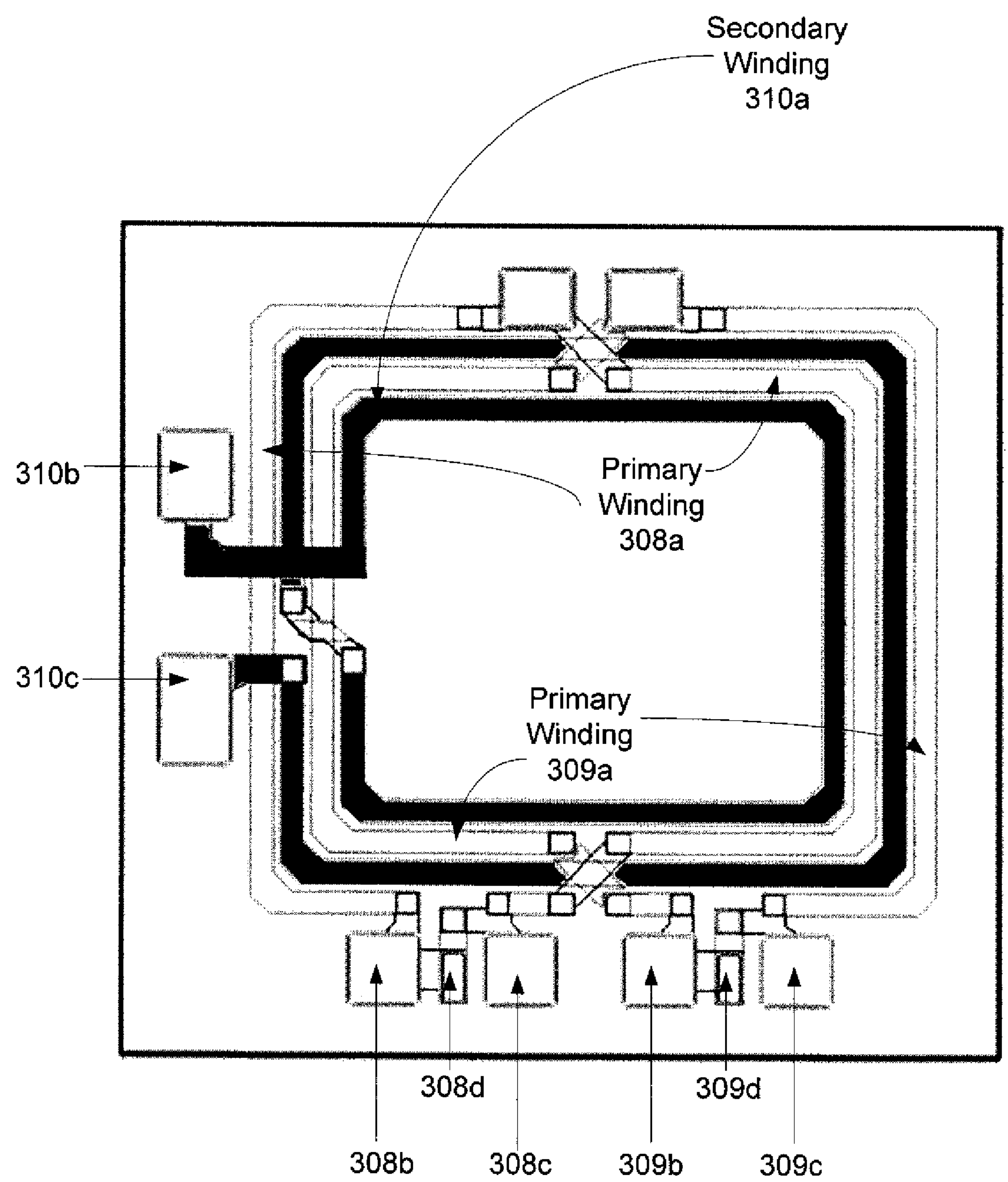
Figure 4:
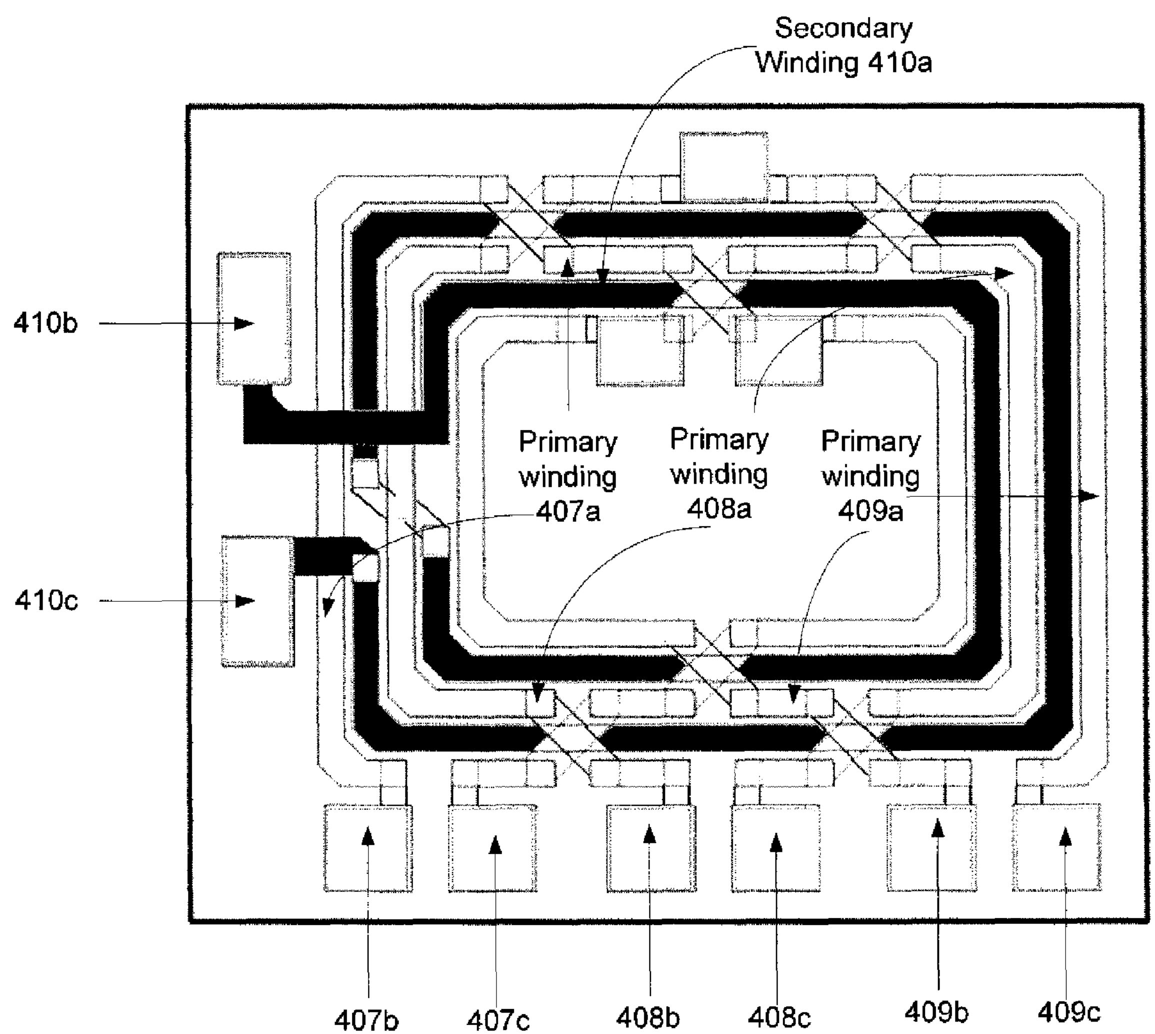
Figure 5:
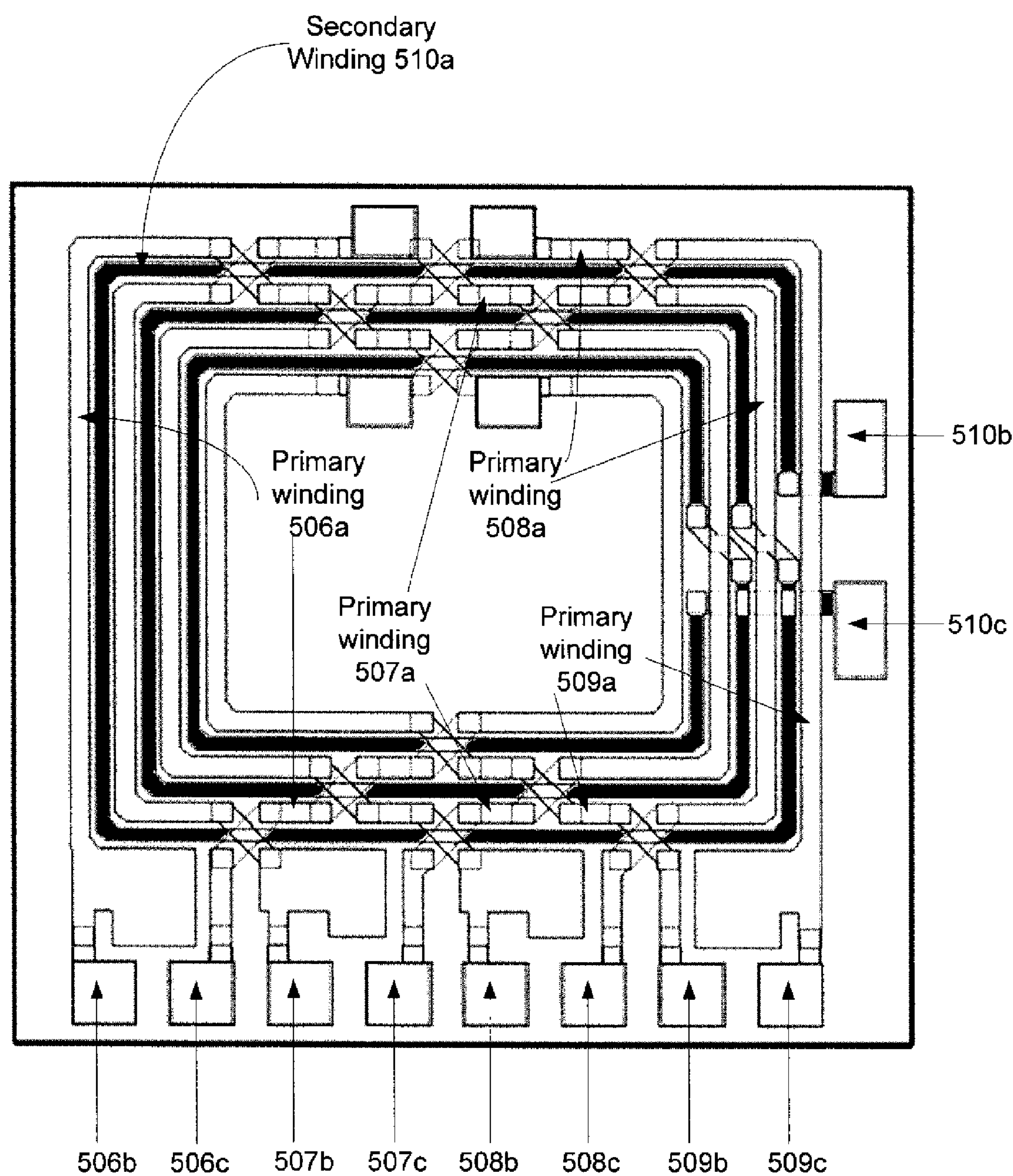

FIGS. 3-5 illustrate top level views of example layouts for a signal combining section implemented as an integrated passive device (IPD), according to example embodiments of the invention.

Figure 6:
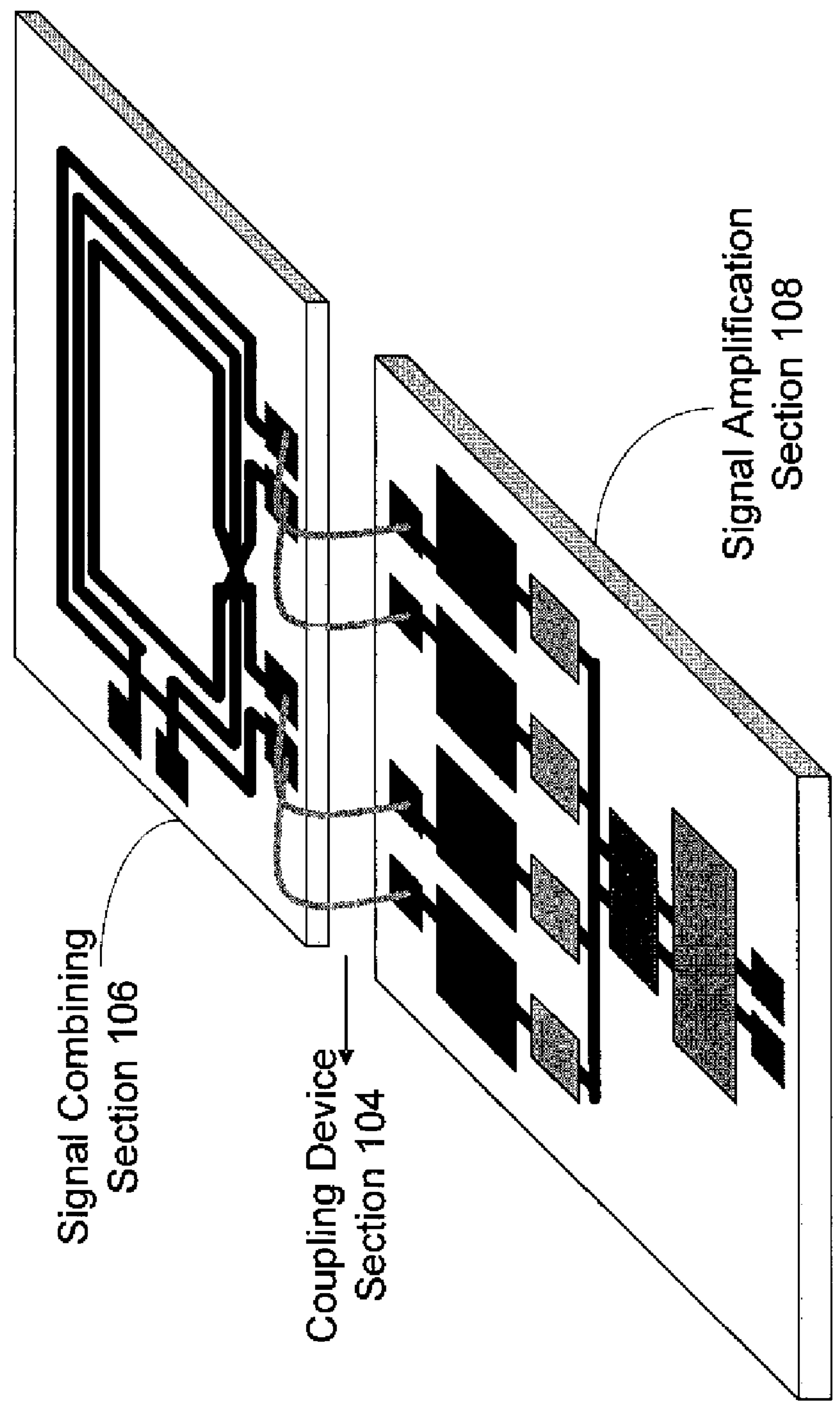

FIG. 6 illustrates an example implementation for a power amplifier, according to an example embodiment of the invention.

Figure 7:
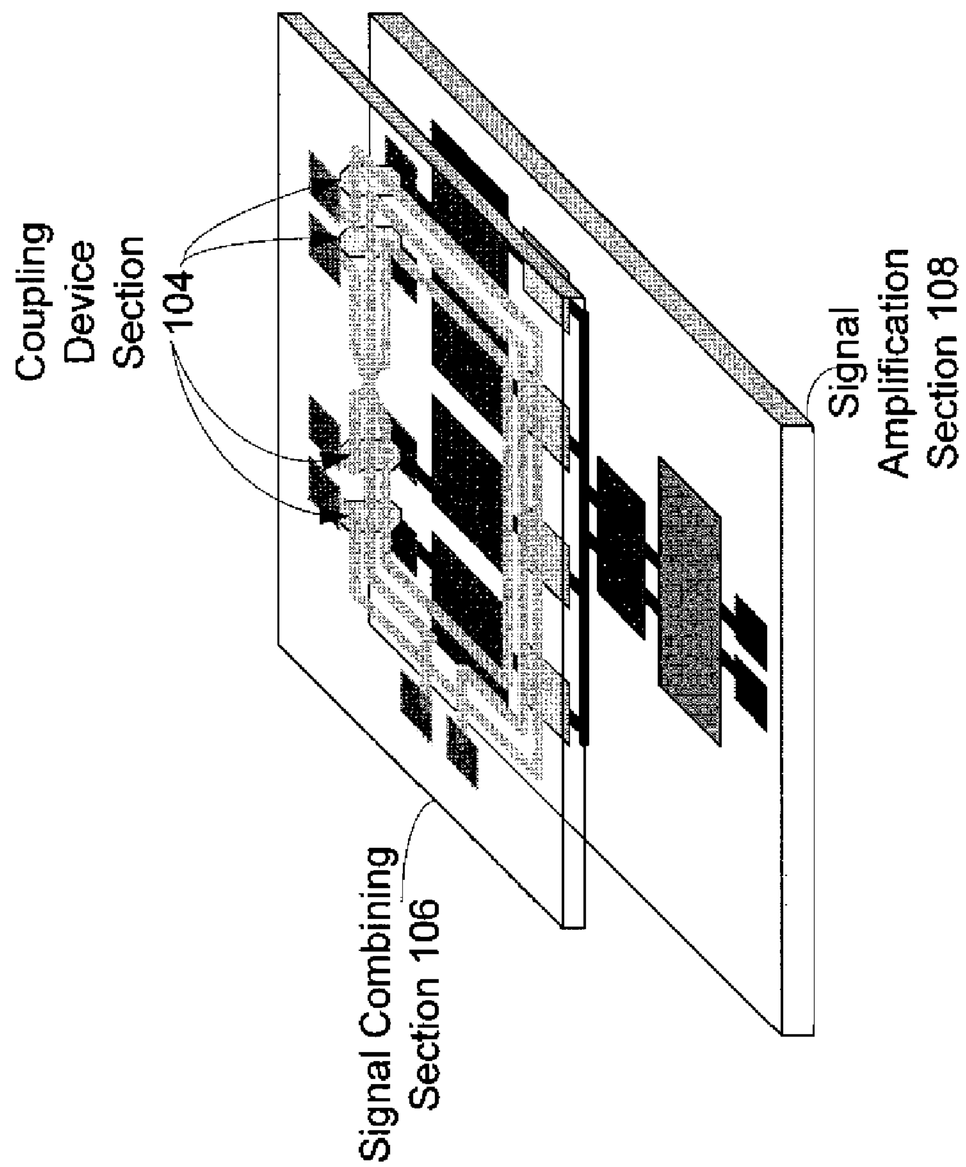

FIG. 7 illustrates an example implementation for a power amplifier, according to an example embodiment of the invention.

DETAILED DESCRIPTION OF THE INVENTION

Example embodiments of the invention now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

FIG. 1 illustrates an example power amplifier 100 in accordance with an example embodiment of the invention. As shown in FIG. 1, the power amplifier 100 may comprise a signal amplification section 108 and a signal combining section 106. The signal amplification section 108 may be physically distinct from the signal combining section 106. For example, the amplification section 108 may be fabricated using one or more first processes or substrates while the signal combining section 106 may be fabricated using one or more second processes or substrates. As an example, the signal amplification section 108 may be implemented using a complementary metal oxide semiconductor (CMOS) process. The one or more first substrates utilized for the signal amplification section 108 may include low-impedance substrates or material layers, including a low-resistance silicon (Si) substrate or material layer. On the other hand, the signal combining section 106 may utilize an integrated passive device (IPD) process. The one or more second substrates utilized for the signal amplification section 108 may include high-resistance substrates or material layers, including high-resistance Si, Gallium Arsenide (GaAs), low-temperature co-fired ceramic (LTCC), printed circuit board (PCB), and/or glass. According to an example embodiment of the invention, the signal amplification section 108 may be an integrated passive device (IPD), as illustrated by FIG. 2.

The signal amplification section 108 and the signal combining section 106 may be electrically connected using a coupling device section 104. According to an example embodiment of the invention, the coupling device section 104 may include one or more electrical connections 142. These electrical connections 142 may include wires, including those utilized in accordance with wire bonding. As another example, the electrical connections 142 may likewise include a ball grid array, which may comprise solder balls or other conductive balls. The ball grid array may support a flip-chip connection between the signal amplification section 108 and the signal combining section 106. It will be appreciated that other connection means may be available for electrical connections 142 without departing from example embodiments of the invention.

Still referring to FIG. 1, the signal amplification section 108 and the signal combining section 106 will now be described in further detail. As shown in FIG. 1, the signal amplification section 108 may include a balun 120 and a plurality of power components. As an example, the power components may comprise a first driver amplifier 122, a plurality of second driver amplifiers 124*a-m*, and a plurality of power amplifiers 126*a-m*.

The signal amplification section 108 may be operative to amplify an input signal 110, according to an example embodiment of the invention. The input signal 110 may be a single-ended input signal according to an example embodiment of the invention. The input signal 110 may be provided to a balun 120 for converting the single-ended input signal to differential input signals. On the other hand, if the input signal 110 is initially provided in differential form, then the balun 120 may not be necessary. The differential input signals may be provided for a first driver amplifier 122. The first driver amplifier 122 may amplify the differential input signals from the balun 120 to generate first amplified signal outputs. The first amplified signal outputs may be provided as inputs to each of a respective one of the plurality of second driver amplifiers 124*a-m*. The plurality of second driver amplifiers 124*a-m* may amplify the first amplified signals to generate a respective plurality of second amplified signal outputs. The respective plurality of second amplified signal outputs may be provided as inputs to each of the respective plurality of power amplifiers 126*a-m*. The power amplifiers 126*a-m* may amplify the respective one of the plurality of the second amplified signal outputs to generate a respective plurality of amplified signals. The plurality of amplified signals may be outputs of the signal amplification device 108. While not illustrated in FIG. 1, the signal amplification section 108 may also include other RF function circuits and controller circuits that may similarly be integrated in addition with the illustrated components using a CMOS process, according to an example embodiment of the invention.

The signal combining section 106 may be operative to combine the plurality of amplified signals from the signal amplification section 108 to an output signal. The signal combining section 106 may also be operative to provide one or more of harmonic rejection, power monitoring, and/or impedance transformation between the signal amplification section and a load. According to an example embodiment of the invention, the signal combining section 106 may include a transformer. The transformer may comprise a plurality of primary windings 160*a-m* and a secondary winding 164, where the plurality of primary windings 160*a-m* may be inductively coupled to the secondary winding 164. The plurality of primary windings 160*a-m* may be operative as inductors 161*a-m*. Optionally, the plurality of primary windings 160*a-m* may be connected to respective capacitors 163*a-m*. The capacitors 163*a-m* may be operative to provide optional impedance transformation, according to an example embodiment of the invention.

The secondary winding 164 may be operative as an inductor 165. The secondary winding 164 may be connected to an optional capacitor 166 for filtering and/or impedance transformation purposes. Although not illustrated in FIG. 1, the signal combining section 106 may also include one or more resistors in electrical contact with the primary windings 106*a-m* or secondary winding 164 to support impedance transformation, filtering and/or harmonic rejection, and/or power monitoring.

In FIG. 1, each of the plurality of primary windings 160*a-m* may receive respective amplified signals from respective ones of the plurality of power amplifiers 126*a-m*. Each of the flux or currents induced by the plurality of primary windings 160*a-m* in the secondary winding 164 may be combined or summed, perhaps in the same phase, according to an example embodiment of the invention. The secondary winding 164 may provide a system output port that provides a output signal 112 to a load. According to an example embodiment of the invention, the load may be an antenna.

It will be appreciated that many variations of the power amplifier 100 may be available in accordance with other example embodiments of the invention. According to an example embodiment of the invention, one or more of the power elements in the signal amplification section 106 may be selectively operated (e.g., selectively turned off or on). As an example, the one or more of the second driver amplifiers 124*a-m* and power amplifiers 126*a-m* may be turned off if a lower power level is desired for the output signal 112. For instance, both the second driver amplifier 124*b* and power amplifier 126*b* may be turned off through the respective bias voltages provided to the second driver amplifier 124*b* and power amplifier 126*b*. According to another example embodiment of the invention, the power amplifier 100 may support multiple bands of operation. To do so, the signal amplification section 100 may include one or more additional sets of balun, first driver amplifier, second driver amplifiers, and power amplifiers to support one or more additional bands of operation. Likewise, the signal combining section 106 may include one or more additional sets of primary windings and secondary winding to support one or more additional bands of operation. Similarly, there may be additional electrical connections 142 for the coupling device section 104 to connect the additional sets of components of the signal amplification section 108 and the signal combining section 106.

FIG. 2 illustrates an example integrated passive device (IPD) stackup 200 for a signal combining section, according to an example embodiment of the invention. The IPD stackup 200 may be utilized for implementing the signal combining section 106, according to an example embodiment of the invention.

The stackup 200 of FIG. 2 may be fabricated on a base substrate 202, according to an example embodiment of the invention. The base substrate 202 may a resistive substrate according to an example embodiment of the invention. For example, the base substrate 202 may be comprised of high-resistance silicon, glass, GaAs, InP, FR4, low temperature co-fired ceramic (LTCC), or yet other substrates. A layer of resistive material such as Nickel-Chromium (NiCr) may be deposited on the base substrate, and etched or patterned to form a resistor 207. Next, a first metal layer 210 may be deposited on the base substrate 202, where the first metal layer 210 may contact the resistor 207. The first metal layer 210 may also be patterned, circuitized, or otherwise provided to form a lower plate of the capacitor 208, a contact pad for the interconnect 216, and one or more portions or feeds of the inductor 209, which may be a spiral inductor according to an example embodiment of the invention. The first metal layer 210 may comprise titanium (Ti), copper (Cu), nickel (Ni), gold (Au), aluminum, another conductive material, or a combination thereof. For example, the lower plate of the capacitor 208 and the one or more portions or feeds of the inductor 209 may be formed of copper while the contact pad for the interconnect may be a combination of Ni/Au, according to an example embodiment of the invention. The inductor 209 may be representative of one or more of the primary windings 160*a-m* and/or secondary winding 164, according to an example embodiment of the invention.

As shown in FIG. 2, a first dielectric layer 204 may be deposited to coat the first metal layer 210. The first dielectric layer 204 may be etched as necessary to provide connections to the metal layer 210 such as for interconnect 216 or other vias. The first dielectric layer 204 may be operative as a capacitor dielectric between the lower and upper plates of the capacitor 208. For a capacitor dielectric, the dielectric layer 204 may have a low dielectric constant, perhaps in an example range of 6.8 or less in dielectric constant. The first dielectric layer 204 may comprise Silicon Nitride (SiN), BCB (Benzo-cyclo-butene), FR4, or ceramic. The second metal layer 212 may be deposited an then patterned, circuitized, or otherwise provided to form one or more portions of the inductor 209 and/or the upper plate of the capacitor 208. The second metal layer 212 may comprise titanium (Ti), copper (Cu), nickel (Ni), gold (Au), aluminum, another conductive material, or a combination thereof. The stackup may then be coated with a second dielectric layer 205. The second dielectric layer 205 may be defined with spacing for the vias such as interconnect 216. The second dielectric layer 205 may comprise Benzo-cyclo-butene (BCB), Silicon (Si), Silicon Nitride (SiN), FR4, ceramic, or another dielectric material. The dielectric layer 205 may have a low dielectric constant, perhaps in an example range of 2.65 or less in dielectric constant.

Next, a third metal layer 214 may be deposited and patterned, circuitized, or provided to form certain passive components, such as a portion of the inductor 209, or connections to a ground plane, connection pads (e.g., load connection pads), and the like. The stackup may then be coated with a third dielectric layer 206. The third dielectric layer 206 may be defined with spacing for the interconnect 216. The third dielectric layer 206 may comprise Benzo-cyclo-butene (BCB), Silicon (Si), Silicon Nitride (SiN), FR4, ceramic, or another dielectric material. The dielectric layer 206 may have a low dielectric constant, perhaps in an example range of 2.65 or less in dielectric constant. The spacing for the interconnect 216 may then be metallized or otherwise filled with conductive material such as Ni/Au. The interconnect 216 may be operative to receive inputs from a signal combining section, according to an example embodiment of the invention. It will be appreciated that while a specific stackup 200 has been illustrated in FIG. 2, one of ordinary skill in the art will appreciate that many variations are possible without departing from example embodiments of the invention.

FIGS. 3-5 illustrate top level views of example layouts for a signal combining section implemented as an integrated passive device (IPD), according to example embodiments of the invention. As shown in FIG. 3, there may be a transformer having two primary windings 308*a*, 309*a* and single secondary winding 310*a*. The primary windings 308, 309 may include about one turn while the single secondary winding 310*a* may include multiple turns. In FIG. 3, the single secondary winding 310*a* may include two turns. The primary winding 308*a* may receive amplified signals from a first power amplifier of the signal amplification section at input ports 308*b* and 308*c*. Likewise, the primary winding 309*b* may received amplified signals from a second power amplifier of the signal amplification section at input ports 309*b* and 309*c*. Optionally, a capacitor 308*d* may likewise be provided between input ports 308*b* and 308*c*, and similarly, a capacitor 309*d* may be provided between input ports 309*b* and 309*c*. As described herein, the capacitors 308*d* and 309*d* may assist in impedance transformation. As shown in FIG. 3, the primary windings 308*a* and 309*a* may be interleaved with the secondary winding 310*a*. Where sections of the primary windings 308*a*, 309*a* and secondary winding 310*a* cross over, routing of those sections may be performed using vias to provide connections above or below the cross-over section.

In FIG. 3, currents may be provided to the primary windings 308*a*, 308*b* from first and second power amplifiers through input ports 308*b*, 308*c* and 309*b*, 309*c*. Magnetically induced currents may be generated in the secondary winding 310*a* and added together in the same phase. The transformer may be designed such that the currents of primary windings 308*a*, 308*b* are in the same direction to prevent self-cancellation, according to an example embodiment of the invention. The output ports 310*b* and 310*c* of the secondary winding 310*a* may be connected to a load, such as an antenna, according to an example embodiment of the invention.

FIG. 4 illustrates an example layout for a signal combining section in which a transformer may include three primary windings 407*a*, 408*a*, and 409*a*, and a single secondary winding 410*a*. According to an example embodiment of the invention, the three primary windings 407*a*, 408*a*, 409*a* may each include about one turn while the single secondary winding 410*a* may include about two turns. The primary winding 407*a* may receive amplified signals from a first power amplifier of the signal amplification section at input ports 407*b* and 407*c*. The primary winding 408*a* may receive amplified signals from a second power amplifier of the signal amplification section at input ports 408*b* and 408*c*. Likewise, the primary winding 409*b* may received amplified signals from a third power amplifier of the signal amplification section at input ports 409*b* and 409*c*. As shown in FIG. 4, the primary windings 407*a*, 408*a*, and 409*a* may be interleaved with the secondary winding 410*a*.

In FIG. 4, currents may be provided to the primary windings 407*a*, 408*a*, 408*b* from first, second, and third power amplifiers through input ports 407*b* & 407*c*, 408*b* & 408*c*, and 409*b* & 409*c*. Magnetically induced currents may be generated in the secondary winding 410*a* and added together in the same phase. The transformer may be designed such that the currents of primary windings 408*a*, 408*b*, and 409*c* are in the same direction to prevent self-cancellation, according to an example embodiment of the invention. The output ports 410*b* and 410*c* of the secondary winding 410*a* may be connected to a load, such as an antenna, according to an example embodiment of the invention.

FIG. 5 illustrates an example layout for a signal combining section in which a transformer may include four primary windings 506*a*, 507*a*, 508*a*, and 509*a*, and a single secondary winding 510*a*. According to an example embodiment of the invention, the four primary windings 506*a*, 507*a*, 508*a*, 509*a* may each include about one turn while the single secondary winding 510*a* may include about three turns. The primary winding 506*a* may receive amplified signals from a first power amplifier of the signal amplification section at input ports 506*b* and 506*c*. The primary winding 507*a* may receive amplified signals from a second power amplifier of the signal amplification section at input ports 507*b* and 507*c*. The primary winding 508*a* may receive amplified signals from a third power amplifier of the signal amplification section at input ports 508*b* and 508*c*. Likewise, the primary winding 509*b* may received amplified signals from a third power amplifier of the signal amplification section at input ports 509*b* and 509*c*. As shown in FIG. 5, the primary windings 506*a*, 507*a*, 508*a*, and 509*a* may be interleaved with the secondary winding 510*a*.

In FIG. 5, currents may be provided to the primary windings 506*a*, 507*a*, 508*a*, 508*b* from first, second, third, and fourth power amplifiers through input ports 506*b* & 506*c*, 507*b* & 507*c*, 508*b* & 508*c*, and 509*b* & 509*c*. Magnetically induced currents may be generated in the secondary winding 510*a* and added together in the same phase. The transformer may be designed such that the currents of primary windings 508*a*, 508*b*, and 509*c* are in the same direction to prevent self-cancellation, according to an example embodiment of the invention. The output ports 510*b* and 510*c* of the secondary winding 510*a* may be connected to a load, such as an antenna, according to an example embodiment of the invention.

FIG. 6 illustrates an example implementation for a power amplifier, according to an example embodiment of the invention. As shown in FIG. 6, the signal amplification section 108 may be substantially coplanar with the signal combining section 106. It will be appreciated that in other embodiments, however, the signal amplification section 108 and the signal combining section 108 may also be in other planes and/or at angles to each other. In FIG. 6, the coupling device section 104 may include wires for bonding and electrically connecting the signal amplification section and the signal combining section. The wires may be formed of a variety of conductive materials, including copper, gold, silver, aluminum, alloys, and the like.

FIG. 7 illustrates an example implementation for a power amplifier, according to an example embodiment of the invention. As shown in FIG. 7, the signal amplification section 108 may be stacked opposite the signal combining section 106. In FIG. 7, the coupling device section 104 may include a ball grid array for electrically connecting the signal amplification section and the signal combining section. The ball grid array may be formed of solder bumps or other conductive balls as well. While not illustrated in FIG. 7, the spacing between the signal amplification section 108 and the signal combining section 106 may be filled with underfill or another dielectric or insulating material.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

What is claimed is:

1. A power amplifier, comprising:

a signal amplification section that includes a plurality of power devices, wherein the signal amplification section receives an input radio frequency (RF) signal, wherein the plurality of power devices are operative to amplify the input RF signal to generate a respective plurality of amplified signals, wherein the signal amplification section is provided on a first substrate;

a signal combining section that is operative to combine the plurality of amplified signals into an output signal for delivery to a load, the signal combining section comprising a resistive substrate, a dielectric layer, and one or more metal layers deposited between the resistive substrate and the dielectric layer, the one or more metal layers patterned to form at least a plurality of primary windings inductively coupled to a single secondary winding, each primary winding coupled to a respective one of the plurality of power devices, wherein the single secondary winding is interleaved with the plurality of primary windings, the single secondary winding including a number of turns N2 such that N2>1, wherein the signal combining section is provided as an integrated passive device that is physically distinct from the first substrate; and a coupling device section that electrically connects the signal amplification section of the first substrate and the signal combining section provided as the integrated passive device.

2. The power amplifier of claim 1, wherein each primary winding receives a respective one of the plurality of plurality of amplified signals from the respective power device; and wherein the secondary winding is operative to provide the output signal for delivery to the load.

3. The power amplifier of claim 1, wherein the plurality of power devices are selectively operable.

4. The power amplifier of claim 1, wherein signal amplification section includes a balun, and wherein the power devices comprise a first driver amplifier, a plurality of second driver amplifiers, and a plurality of power amplifiers.

5. The power amplifier of claim 4, wherein the input RF signal is a single-ended input signal, wherein the balun is operative to convert the single-ended input signal to differential signal outputs, wherein the first driver amplifier is operative to amplify the differential signal outputs to generate first amplified signal outputs, wherein each of the plurality of second driver amplifiers are operative to further amplify the first amplified signal outputs to generate a plurality of respective second amplified signal outputs, wherein each of the plurality of respective second amplified signal outputs is provided to a respective one of the plurality of power amplifiers to generate the respective plurality of amplified signals.

6. The power amplifier of claim 1, wherein the signal combining section is further operative to provide one or more of (i) harmonic rejection, (ii) power monitoring, or (iii) impedance transformation between the signal amplification section and the load.

7. The power amplifier of claim 1, wherein the signal combining section comprises (i) at least one wire in accordance with a wire bond connection or (ii) at least one solder bump in accordance with a flip-chip connection.

8. The power amplifier of claim 1, wherein the signal combining section includes a base substrate, a plurality of metal layers supported by the base substrate, at least one dielectric layer separating at least two of the plurality of metal layers, and at least one via hole electrically connecting two of the plurality of metal layers.

9. The power amplifier of claim 8, wherein the base substrate comprises at least one of (i) Silicon (Si), (ii) Gallium Arsenide (GaAs), (iii) InP, (iv) FR4, or (v) low temperature co-fired ceramic (LTCC).

10. The power amplifier of claim 8, wherein the at least one dielectric layer is an insulator layer having silicon oxide, BCB (Benzo-cyclo-butene), SiN (Silicon-Nitride), FR4, or ceramic.

11. The power amplifier of claim 1, wherein the signal amplification section and the signal combining section are substantially coplanar, and wherein the signal combining section comprises at least one wire connection between the signal amplification section and the signal combining section.

12. The power amplifier of claim 1, wherein the signal amplification section and the signal combining section are stacked opposite each other, wherein the signal combining section comprises at least one solder bump between the signal amplification section and the signal combining section.

13. The power amplifier of claim 1, wherein the signal amplification section is implemented using one or more low-resistance substrates and wherein the signal combining section comprising the resistive substrate and the dielectric layer is implemented using one or more high-resistance substrates.

* * * * *